United States Patent [19]

Fuse

[11] Patent Number: 4,831,597
[45] Date of Patent: May 16, 1989

[54] DYNAMIC RANDOM ACCESS SEMICONDUCTOR MEMORY WHEREIN THE RAS AND CAS STROBES RESPECTIVELY SELECT THE BIT LINE AND WORD LINE PAIRS

[75] Inventor: Tsuneaki Fuse, Tokyo, Japan

[73] Assignee: Kabushiki Kaisha Toshiba, Kawasaki, Japan

[21] Appl. No.: 118,009

[22] Filed: Nov. 9, 1987

[30] Foreign Application Priority Data

Nov. 25, 1986 [JP] Japan .................................. 61-279931

[51] Int. Cl.⁴ .......................... G11C 8/00; G11C 7/02; G11C 11/34
[52] U.S. Cl. .................................... 365/233; 365/193; 365/208; 365/177
[58] Field of Search ................. 365/149, 177, 190–193, 365/205–208, 181, 203, 222, 233, 230

[56] References Cited

U.S. PATENT DOCUMENTS 4,656,613  4/1987  Norwood et al. .............. 365/208 X
4,685,089  8/1987  Patet et al. ...................... 365/233 X

FOREIGN PATENT DOCUMENTS 61-142594  6/1986  Japan .

Primary Examiner—Terrell W. Fears
Assistant Examiner—Alfonso Garcia
Attorney, Agent, or Firm—Oblon, Fisher, Spivak, McClelland & Maier

[57] ABSTRACT

A dynamic random access semiconductor memory device includes a bit line pair to which at least one memory cell is connected, a bit line sense amplifier connected between the bit line pair and an input/output line pair, and a word line connected to the memory cell. The bit line sense amplifier includes a differential amplifier whose driving transistors are bipolar transistors. The bit line pair is selected at a first timing by a row address signal and the word line is selected at a second timing following the first timing by a column address signal.

5 Claims, 4 Drawing Sheets

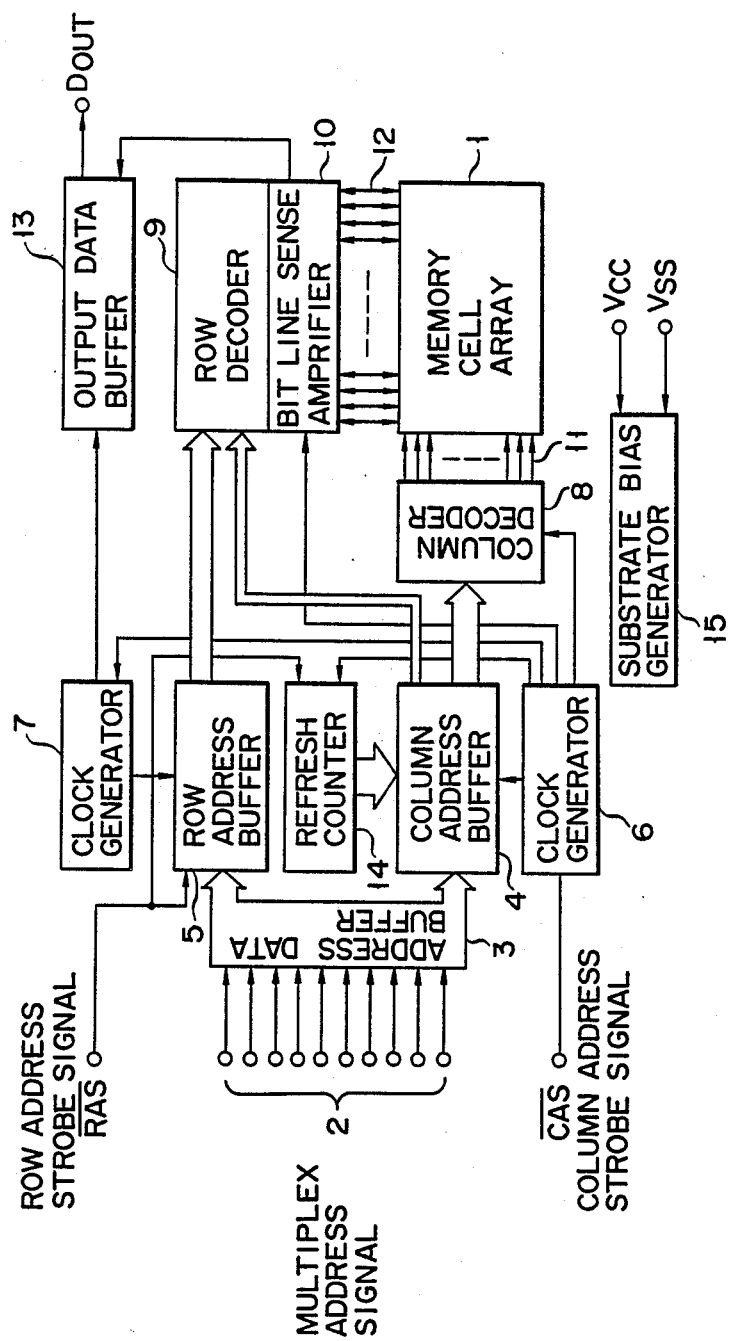
F I G. 2

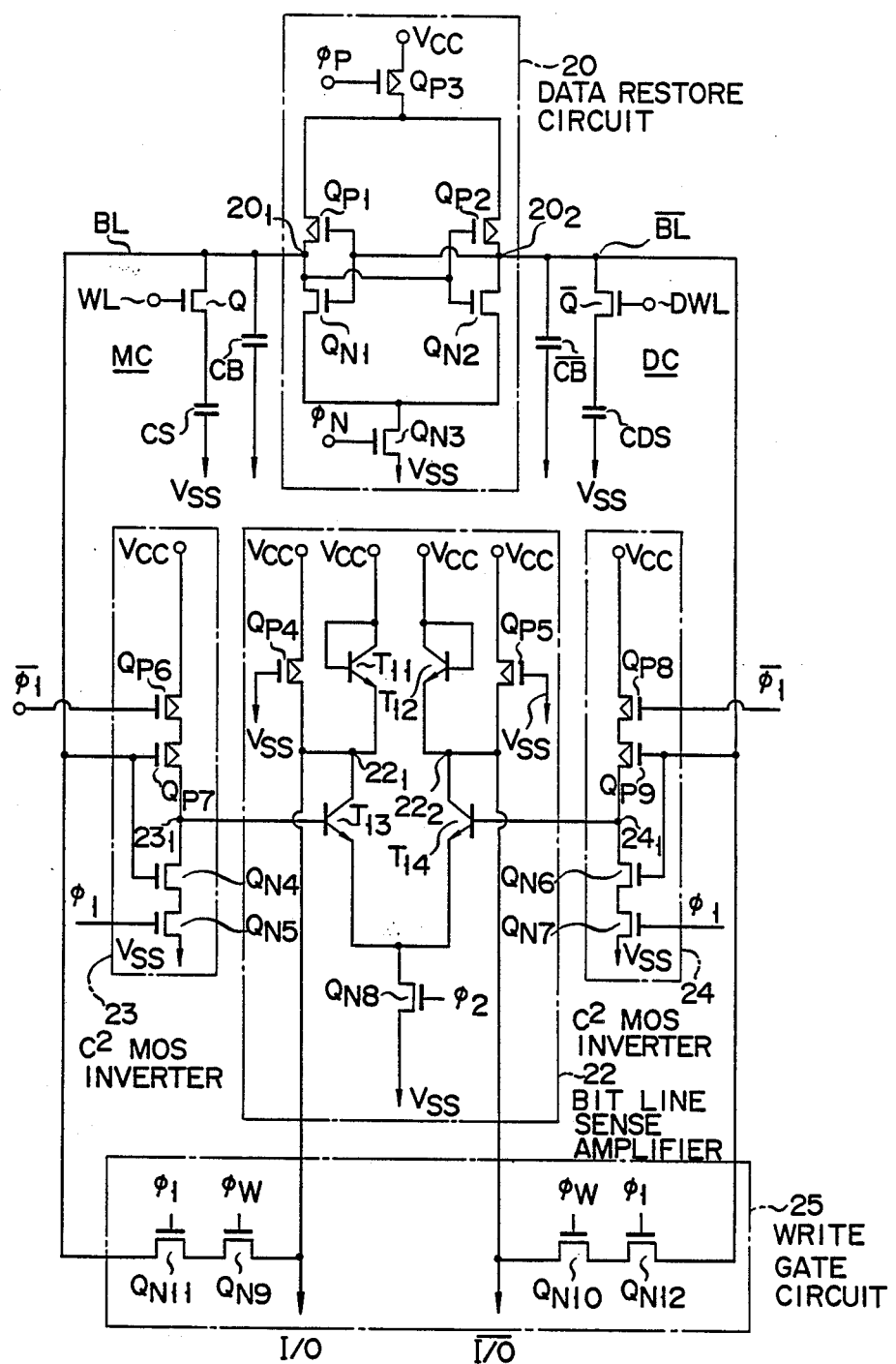
F I G. 3

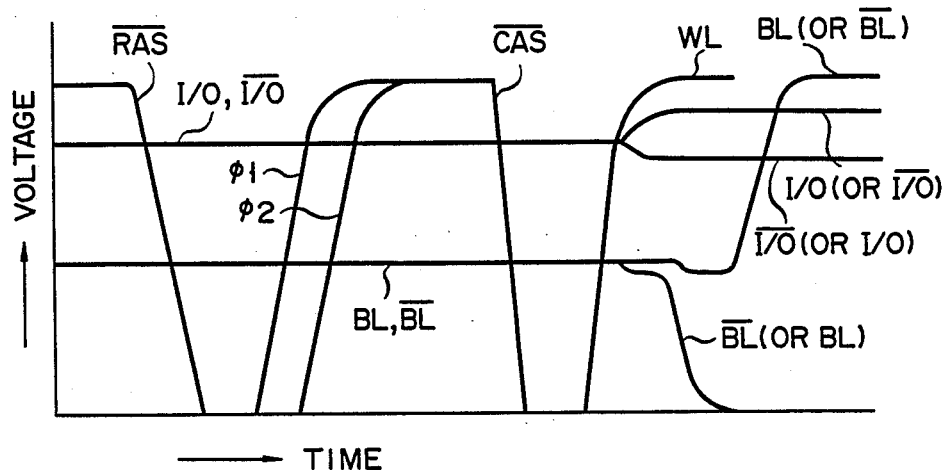
F I G. 4

DYNAMIC RANDOM ACCESS SEMICONDUCTOR MEMORY WHEREIN THE RAS AND CAS STROBES RESPECTIVELY SELECT THE BIT LINE AND WORD LINE PAIRS

BACKGROUND OF THE INVENTION

This invention relates to a dynamic random access semiconductor memory device which can decrease access time.

The integration density of a dynamic random access semiconductor memory device (dRAM) is more and more improved with an advance in the microminiaturization technique. That is, the performance of memory cells is improved through the microminiaturization of memory cells and a great improvement has been achieved in the access time of the memory cells. If the gate length of the MOS transistors in a memory is reduced on the order of 0.5 $\mu$m in odder to effect that microminiaturization, a voltage which is applied to the memory cell has to be lowered so as to secure the reliability of memory cells. The limit has already been reached for the dRAM to operate at high speed with the use of microminiaturized memory cells.

The conventional dRAM comprised of CMOS's (complementary MOS) transistors will be explained below by referring to the bloc diagram of FIG. 1. In the circuit arrangement shown in FIG. 1, memory cell array 1 is comprised of a matrix array of memory cells. Reference numeral 2 shows a multiplex address signal; 3, an address data buffer; 4, a column address buffer; 5, a row address buffer, 6 and 7 clock generators; 8, a column decoder; 9, a row decoder; 10, a bit line sense amplifier, 11, word lines; 12, bit lines; 13, an output data buffer; 14, a refresh counter; and 15, a substrate bias signal generator. The signal paths are as indicated in FIG. 1. Multiplex address signal 2 contains row and column address signals. The column address signal is responsive to a $\overline{CAS}$ (column address strobe) signal to allow it to be coupled to column decoder 8 through address data buffer 3 and column address buffer 4. On the other hand, the row address signal is responsive to a $\overline{RAS}$ (row address strobe signal) to allow it to be coupled to row decoder 9 through address data buffer 3 and row address buffer 5. The output of row decoder 9 selects word line 11 while, on the other hand, the output of column decoder 8 selects bi line 12. Bit line sense amplifier 10 is connected between a bit line pair and an I/O (input/output) line pair to amplify a memory cell output so that it is supplied to an I/O line.

In the conventional dRA,, at a first timing a row address is supplied to row address buffer 5 in response to the $\overline{RAS}$ signal, so that a word line is selected. At a subsequent timing following the first timing, a column address is supplied to column address buffer 4 in response to the $\overline{CAS}$ signal, so that a bit line is selected. Further, for a differential amplifier constituting a bit line sense amplifier, bipolar transistors have not been used as driving transistors. As a result, about 30 nsec has been required for the operation in which the data in a memory cell is delivered via a selected bit line to a bit line sense amplifier where determination is made as to whether that data is a "H" or a "L" level, the data is transferred to an I/O line and the transferred data is amplified by an I/O line sense amplifier. Such a long time has offered a bar to reading the dRAM data at high speed.

SUMMARY OF THE INVENTION

Accordingly, the object of this invention is to provide a dynamic random access semiconductor memory device which can decrease access time with the use of different selection timings for bit and word lines and of a different arrangement of a bit line sense amplifier from the counterpart of a conventional dRAM.

According to this invention a dynamic random access semiconductor memory device is provided which includes a plurality of dynamic random access memory cells integrated on a semiconductor substrate, a means for selecting a word line pair and a bit line pair, connected to at least one of the aforementioned memory cells, by a multiplex address signal containing row and column address signals, and a bit line sense amplifier including a differential amplifier connected between the bit line pair and a corresponding I/O (input/output line pair. Driving transistors in the differential amplifier are comprised of bipolar transistors. The bit line pair is selected at a first timing by a row address signal of the multiplex address signal and the word line pair is selected, at a second timing following the aforementioned first timing, by a column address signal of the multiplex address signal.

BRIEF DESCRIPTION OF THE DRAWINGS

FIG. 2 is a block diagram showing a dynamic random access semiconductor memory device according to an embodiment of this invention;

FIG. 3 is a circuit diagram showing part of the block diagram of FIG. 2, and

FIG. 4 is an operation timing diagram of FIG. 3.

DETAILED DESCRIPTION OF THE PREFERRED EMBODIMENTS

Figure 1:
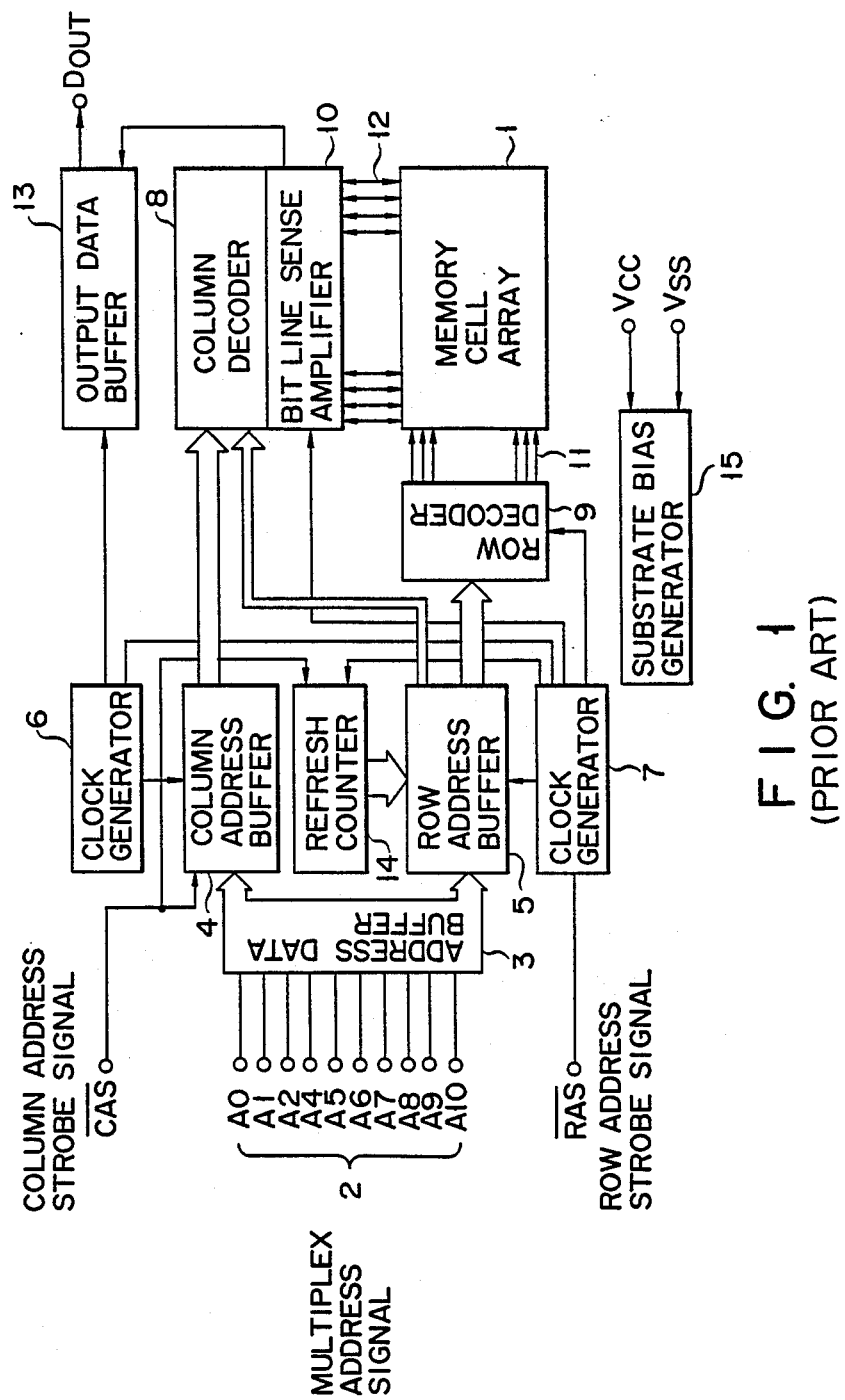
FIG. 1 is a block diagram showing a conventional dRAM.

A dynamic random access semiconductor memory device (dRAM) according to the embodiment of this invention will be explained below with reference to FIGS. 2 to 4.

In FIG. 2 the same reference numerals are employed to designate parts or elements corresponding to those shown in FIG. 1. The dRAM of this invention (FIG. 2) is different from the conventional dRAM in the following respects.

That is, as shown in FIGS. 2 to 4, at a first timing a row address signal of a multiplex address signal is coupled to row address buffer 5 in response to a $\overline{RAS}$ signal and, in this case, a bit line pair, BL, $\overline{BL}$ is selected as opposed to the case where a word line pair WL, DWL is selected in the prior art. At the next subsequent timing, a column address signal is coupled to column address buffer 4 in response to a $\overline{CAS}$ signal, so that a word line pair WL, DWL is selected as opposed to the case where a bit line pair BL, $\overline{BL}$ is selected at said subsequent timing in the prior art. Further, according to this invention, bipolar transistors are employed as driving transistors for a bit line sense amplifier connected to a bit line pair, noting that in the prior art MOS transistors have been used as the driving transistors.

FIG. 3 is a circuit diagram showing an interconnecting relation among a memory cell, a bit line pair, a word line pair, a bit line sense amplifier and an I/O line pair in the dRAM of this invention. The bit line pair contains first and second bit lines BL and $\overline{BL}$. The memory cell MC is comprised of one MOS transistor Q having its drain connected to the first bit line BL and one capacitor $C_S$ connected between the source of MOS transistor Q and source voltage source Vss. $C_B$ in FIG. 3 represents a capacitance for the bit line BL. The MOS transistor Q has its gate connected to a word line WL. A dummy memory cell DC is comprised of one dummy MOS transistor $\overline{Q}$ having its drain connected to the second bit line $\overline{BL}$ and one dummy capacitor CDS connected between the source of the MOS transistor $\overline{Q}$ and the source voltage source Vss. $C_B$ a capacitance on the bit line $\overline{BL}$. The dummy MOS transistor Q has its gate connected to dummy word line DWL. Reference numeral 20 in FIG. 3 represents a CMOS F.F, (Complementary MOS flip-flop or data restore circuit) which serves to restore data corresponding to a memory cell. The CMOS F.F. includes CMOS transistors $Q_{P1}$, $Q_{N1}$; $Q_{P2}$, $Q_{N2}$ and $Q_{P3}$, $Q_{N3}$, all of which are connected between the drain voltage source Vcc and the source voltage source Vss. Output nodes $20_1$ and $20_2$ of the CMOS F.F. are connected to the bit lines BL and $\overline{BL}$, respectively. Differential amplifier 22 constituting a bit line sense amplifier and connected between the drain voltage source Vcc and the source voltage source Vss includes first and second bipolar driving transistors $T_{13}$ and $T_{14}$, bipolar load transistors $T_{11}$ and $T_{12}$, P channel MOS transistors $Q_{P4}$, $Q_{P5}$, and n channel MOS transistor $Q_{N8}$ connected between the emitters of transistors $T_{13}$ and $T_{14}$ and the source voltage source Vss. I/O and $\overline{I/O}$ lines (input/output lines) are connected to output nodes $22_1$ and $22_2$, respectively, and to a write gate circuit 25. Write gate circuit 25 includes a series circuit of MOS transistors $Q_{N9}$ and $Q_{N11}$ connected between the I/O line and the bit line BL with the gates of $Q_{N9}$ and $Q_{N11}$ supplied with a write control signal $\phi_W$ and column selection signal $\phi_1$, respectively, and series circuit of MOS transistors $Q_{N10}$ and $Q_{N12}$ connected between the $\overline{I/O}$ line and the bit line BL with the gates of MOS transistors $Q_{N10}$ and $Q_{N12}$ supplied with a write control signal $\phi_W$ and column selection signal $\phi_1$, respectively. The data from the I/O line is transferred to the bit line pair BL, $\overline{BL}$ through a write circuit selected by the column select signal $\phi_1$, and written into the memory cell. First $C^2$ MOS inverter (clocked complementary MOS inverter) 23 is connected between the bit line $\overline{BL}$ and the base of first driving transistor $T_{13}$, and second $C^2$ MOS inverter 24 is connected between the bit line $\overline{BL}$ and the base of second driving transistor $T_{14}$. These $C^2$ MOS inverters are used to provide a DC separation between the bit line BL and the output node $23_1$ and between the bit line $\overline{BL}$ and output node $24_1$. First $C^2$ MOS inverter 23 includes a series circuit of P channel MOS transistors $Q_{P6}$ and $Q_{P7}$ connected between the drain voltage source Vcc and output node $23_1$ with the gate of MOS transistor $Q_{P7}$ connected to the bit line BL and with the gate of MOS transistor $Q_{P6}$ supplies with the clock $\overline{\phi_1}$. First $C^2$ MOS inverter 23 further includes a series circuit of n channel MOS transistors $Q_{N4}$ and $Q_{N5}$ connected between the source voltage source Vss and output node $23_1$ with the gate of transistor $Q_{N4}$ connected to the bit line BL and with the gate of transistor $Q_{N5}$ supplied with the clock $\phi_1$. Second $C^2$ MOS inverter 24 includes a series circuit of MOS transistors $Q_{P8}$ and $Q_{P9}$ connected between the drain voltage source Vcc and output node $24_1$ with the gate of transistor $Q_{P9}$ connected to the bit line $\overline{BL}$ and with the gate of transistor $Q_{P8}$ supplied with the clock $\overline{\phi_1}$. A series circuit of n channel MOS transistors $Q_{N6}$ and $Q_{N7}$ is connected between the source voltage source Vss and output node $24_1$ with the gate of transistor $Q_{N6}$ connected to the bit line $\overline{BL}$ and with the gate of transistor $Q_{N7}$ supplied with the clock $\phi_1$.

The operation of a dAAM of this invention will now be explained below with reference to FIGS. 2 to 4.

In the active cycle of the dRAM, a $\overline{RAS}$ (row address strobe) signal falls at a first timing and a row address signal is fed to row address buffer 5 which in turn supplies it to row decoder 9. Then, the clock $\phi_1$ rises and $C^2$ MOS inverters 23 and 24 are activated. Nearly at the same time the aforementioned clock $\phi_2$ rises and differential amplifier 22 is activated. At the second timing following the first timing, a $\overline{CAS}$ (column address strobe) signal falls and a column address signal is supplied to column address buffer 4. The column address is decoded by column decoder 8 to produce a decoded column address signal by which the word line WL and dummy word line DWL are selected. Through the aforementioned operation the data of the memory cell MC is transferred to the bit line pair BL, $\overline{BL}$ and, at the same time, input to differential amplifier 22 where it is amplified. The amplified data is transferred to the I/O line pair I/O, $\overline{I/O}$.

If an I/O line sense amplifier, not shown, and output data buffer 13 are also comprised of a differential amplifier including bipolar driving transistors, data can be taken out of data output terminal Dout without requiring any clock control.

Restoring data into a memory cell is achieved by sequentially supplying the clock $\phi_N$ to the gate of n channel MOS transistor $Q_{N3}$ and the clock $\phi_p$ to the gate of p channel MOS transistor $Q_{P3}$ to cause F.F. (data restore circuit) to be activated. Where data "1" is read out of a memory cell and data "1" is restored into memory cell, it is only necessary to restore Vcc voltage into the capacity $C_S$ of the memory cell MC with a voltage on the bit line BL connected to the drain voltage (Vcc) and a voltage on the bit line $\overline{BL}$ connected to the source voltage Vss. On the other hand, where data "0" is restored into the memory cell upon reading data "0", it is only necessary to render a voltage on the bit line BL at the Vss level and a voltage on the bit line $\overline{BL}$ at the Vcc level.

In this case all F.Fs 20 are activated after a lapse of a predetermined time following the selection of the word line.

According to this invention, a dRAM is provided which can perform the same high-speed operation as a sRAM (static random access memory), while retaining the high degree of integration of the memory cells. Although, in the conventional 1 M bit dRAM, the access time is of the order of 96 nsec, the dRAM of this invention has been able to make the access time one half that of the conventional counterpart.

The sensitivity of a bit line sense amplifier is determined by a ratio of the capacitance of the capacitor $C_S$ in the memory cell MC to the bit line capacitance $C_B$. Therefore, it has been necessary in the prior art to make the capacitance $C_S$ at a value of over 40 fF so that the sensitivity of the bit line sense amplifier may not be lowered.

According to this invention, even if the capacitance of the capacitor $C_S$ of the memory cell is of the order of below 20 fF, the sense amplifier can adequately operate because the current amplifying type bit line sense amplifier is employed. For a high-integration dRAM (over 4M), a complicated cell manufacture step is involved in achieving a capacitor $C_S$ of over 40 fF, resulting in lower yield and in increased cost. According to this invention it is possible to make the manufacturing step simpler and lower in cost.

What is claimed is:

1. A dynamic random access semiconductor memory device comprising: a plurality of dynamic random access memory cells integrated in a semiconductor substrate; means for selecting a word line pair to which at least one of said memory cells is connected and a bit line pair connected to said memory cell, selecting including a clocking means for timing generation of a row address signal and a column address signal; and a bit line sense amplifier including a differential amplifier connected to said bit line pair;

wherein driving transistors of said differential amplifier are bipolar transistors and said bit line pair is selected at a first timing by said row address signal of a multiplex address signal and said word line pair is selected at a second timing following said first timing by said column address signal of said multiplex address signal.

2. A dynamic random access semiconductor memory device according to claim 1, wherein said device further comprises a complementary MOS flip-flop connected between a drain voltage source and a source voltage source for restoring data into said memory cell, input/output nodes thereof being connected to said bit line pair, respectively.

3. A dynamic random access semiconductor memory device according to claim 1, wherein said memory cell comprises one MOS transistor whose drain is connected to a bit line and one capacitor connected between the source of said MOS transistor and a source voltage source.

4. A dynamic random access semiconductor memory device according to claim 1, wherein clocked complementary MOS inverters are connected between one of said bit line pairs and the base of one of said driving transistors and between the other of said bit line pair and the base of the other of said driving transistors, respectively, preventing a DC component path from being made between said bit line and said base, each of said inverters being connected to a drain voltage source and a source voltage source.

5. A dynamic random access semiconductor memory device comprising;

first and second bit lines constituting a bit line pair;

a C MOS F.F (complementary MOS flip-flop) connected between a drain voltage source and a source voltage source for restoring data into a memory cell, a first output node thereof being connected to said first bit line and a second output node thereof being connected to said second bit line;

a memory cell including one MOS transistor whose drain is connected to said first bit line and one capacitor connected between the source of said MOS transistor and said source voltage source, the gate of said MOS transistor being connected to a word line;

a dummy memory cell including one dummy MOS transistor whose drain is connected to said second bit line, and one dummy capacitor connected between the source of said dummy MOS transistor and said source voltage source, the gate of said dummy MOS transistor being connected to a dummy word line;

a differential amplifier connected between said drain voltage source and said source voltage source and including first and second bipolar transistors used as driving transistors, said differential amplifier being used as a bit line sense amplifier;

a first C$^2$MOS inverter (clocked complementary MOS inverter) connected between said drain voltage source and said source voltage source, whose input is connected to said first bit line and whose output is connected to the base of said first bipolar transistor, for preventing a DC component path from being made between said bit line an said base;

a second C$^2$MOS inverter connected between said drain voltage source and said source voltage source, whose input is connected to said second bit line and whose output is connected to the base of said second bipolar transistor, for preventing a DC component path from being made between said bit line and said base; wherein said bit line pair is selected at a first timing by a row address signal of a multiplex address signal for activating said first and second C$^2$MOS inverters and said differential amplifier and; a word line pair including said word line and said dummy word line is selected at a second timing following said first timing by a column address signal of said multiplex address signal.

* * * * *